United States Patent [19]

Takahashi et al.

[11] Patent Number: 4,918,466

[45] Date of Patent: Apr. 17, 1990

[54] LIGHT BEAM IMAGE RECORDING APPARATUS HAVING COMMONLY DRIVEN MEMBER

[75] Inventors: Kazuhisa Takahashi, Yokohama; Keiichi Kawasaki, Tokyo; Yuji Itoh, Chigawaki, all of Japan

[73] Assignee: Canon Kabushiki Kaisha, Tokyo, Japan

[21] Appl. No.: 310,500

[22] Filed: Feb. 13, 1989

Related U.S. Application Data

[63] Continuation of Ser. No. 17,637, Feb. 24, 1987, abandoned, which is a continuation of Ser. No. 713,702, Mar. 19, 1985, Pat. No. 4,698,648.

[30] Foreign Application Priority Data

Mar. 22, 1984 [JP]  Japan .................................. 60-053485
Nov. 27, 1984 [JP]  Japan .................................. 60-250308

[51] Int. Cl.$^4$ .............................................. B01D 15/14
[52] U.S. Cl. ...................................... 346/108; 358/296
[58] Field of Search .................... 346/108, 107 R, 160; 358/296, 300, 302

[56] References Cited

U.S. PATENT DOCUMENTS

| | | | |
|---|---|---|---|
| 4,307,408 | 12/1981 | Kiyohare | 346/108 |
| 4,314,261 | 2/1982 | Martinage | 346/108 |
| 4,457,506 | 7/1984 | Ashbee et al. | 355/108 |
| 4,516,142 | 5/1985 | Yamamoto et al. | 346/108 |
| 4,613,877 | 9/1986 | Spencer et al. | 346/108 |
| 4,698,648 | 10/1987 | Takahashi et al. | 346/108 |

Primary Examiner—Bruce A. Reynolds
Assistant Examiner—Mark Reinhart
Attorney, Agent, or Firm—Fitzpatrick Cella Harper & Scinto

[57] ABSTRACT

An image recording method having a first step of recording an image on a first area of a recording medium by the major scanning by a light beam scanning optical system and a first subsidiary scanning in which the recording medium is moved relative to the light beam scanning optical system in a direction intersecting the major scanning, and a second step of recording an image on a second area of the recording medium by the major scanning and a second subsidiary scanning in which the recording medium is moved relative to the light beam scanning optical system so that the first area again crosses the scanning area of the light beam scanning optical system.

9 Claims, 10 Drawing Sheets

LIGHT BEAM IMAGE RECORDING APPARATUS HAVING COMMONLY DRIVEN MEMBER

This application is a continuation of application Ser. No. 017,637 filed Feb. 24, 1987, now abandoned, which was a continuation of Ser. No. 713,702 filed Mar. 19, 1985, now U.S. Pat. No. 4,698,648.

BACKGROUND OF THE INVENTION

This invention relates to an image recording apparatus, and more particularly to a light beam multiformat camera used in the field of medical treatment to record an the obtained by output image such as CT (computed tomography), DR (digital radiology), NMR (nuclear magnetic resonance) or an ultrasonic wave on a recording sheet by a light beam while dividing the image into a plurality of images.

2. Description of the Prior Art

Figure 1:
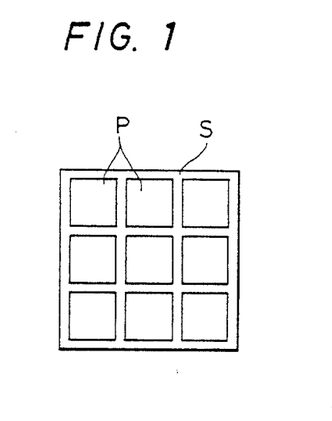
FIG. 1 shows a recording sheet on which a plurality of picture planes are divisionally recorded (multiformat-recorded).

For the image recording of a diagnostic apparatus or an like using CT, DR, NMR or ultrasonic wave, use has often been made of a camera for photographing an output CRT image on a recording medium such as a film through an optical system, particularly a multiformat camera for divisionally recording a plurality of picture planes P on a recording sheet S as shown in FIG. 1 of the accompanying drawings. However, it has the following disadvantages:

(i) Since an image is first projected on a CRT and then is photographed on a recording sheet through an optical system, the sharpness of the image is impaired;

(ii) The CRT image has a great reduction in quantity of marginal light; and (iii) The CRT multi-image is narrow in dynamic range.

Figure 2:
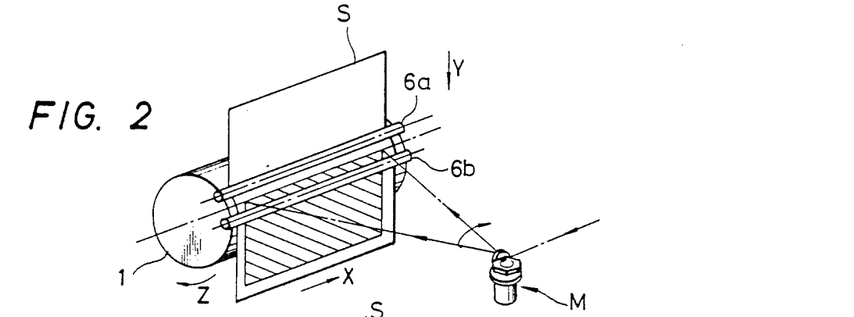
FIG. 2 is a perspective view of a light beam image recording apparatus according to the prior art.
Figure 3:
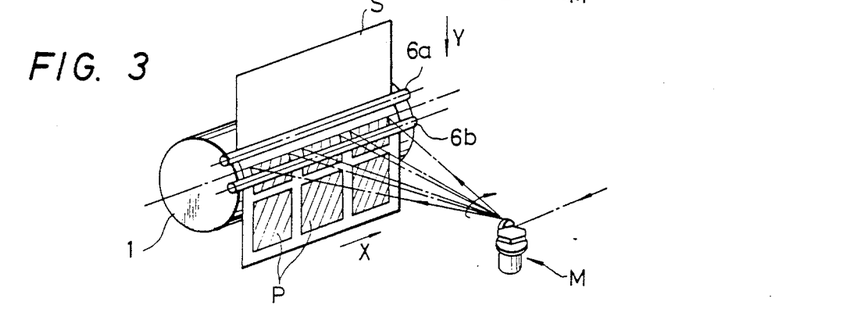
FIG. 3 is a perspective view showing a case where multiformat recording is effected by the use of the light beam image recording apparatus according to the prior art.
Figure 4:
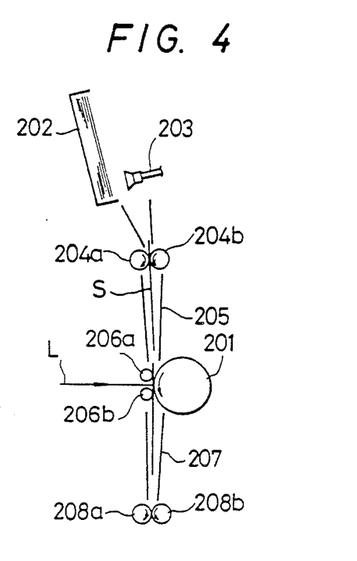
FIG. 4 is a side view of the apparatus according to the prior art.

These disadvantages arise from the intervention of the CRT and recently, to eliminate such disadvantages, a system has been proposed in which an image in the form of an electrical signal is directly recorded on a recording sheet by a light beam. Generally, a light beam image recording apparatus is known which has beam generating means and beam modulating means and in which, as shown in FIG. 2 of the accompanying drawings, major scanning (the direction of arrow X) is effected by a light beam scanning optical system 27 and subsidiary scanning (the direction of arrow Y) is effected with a recording sheet 2 along a drum 13 which makes one full rotation in the direction of arrow Z. A detailed side view of such apparatus is shown in FIG. 4 of the accompanying drawings. It would come to mind to use this apparatus to divisionally record a plurality of images P on a recording sheet 2 as shown in FIG. 3 of the accompanying drawings, that is, to endow the apparatus with the function as a light beam multiformat camera.

Now, in the conventional apparatus shown in FIG. 4, a recording sheet taken out from a supply magazine 202 by a taking-out mechanism 203 and supplied to a drum 201 is fed to the drum 201 via is recorded by a laser beam L while being fed by urge rollers 206a, 206b and is discharged, for example, into a container magazine by discharging rollers 208a, 208b via a guide plate 207. During the image recording, the recording sheet S is fed along the drum 201 only by the driving of the drum 201 in a state in which the recording sheet is completely separate from the rollers 204a, 204b, 208a, 208b forward and rearward of the drum 201, that is, a state in which any other force than gravity is not applied to the recording sheet. In this method, however, the spacings between the drum 201 and the rollers 204a, 204b, 208a, 208b must be equal to at least the length of the recording sheet S in the feeding direction, and this leads to a disadvantage that the recording unit becomes bulky.

Further, in the above-described conventional apparatus, all information is recorded on the recording sheet by one subsidiary scanning, and this leads to the following disadvantages:

(i) Since a plurality of types of image information must be stored in a single operation, there is required an image memory of great capacity.

(ii) Further, the scanning range of the major scanning must be as wide as the whole picture plane in the major scanning direction, and the distortion in the marginal portion wherein the scanning angle is great becomes great. It is required in the image of each picture plane of a multiformat camera for medical treatment that the distortion be small as possible, but the conventional apparatus cannot meet such requirement.

(iii) To enhance the resolving power of each divisional image, the diameter of the scanning beam must be made small, but since the scanning range is wide as described under item (ii) above, it is difficult to design a scanning optical system in which the diameter of the scanning beam is small.

SUMMARY OF THE INVENTION

It is an object of the present invention to provide an image recording apparatus which can be made compact by winding a recording medium on a drum and by bringing the carrying-in and carrying-out routes of the recording medium to the drum into a predetermined relation.

It is a further object of the present invention to provide an image recording apparatus which is capable of recording images of high quality.

It is still a further object of the present invention to provide an image recording method and apparatus which only requires a small memory capacity of image information when recording a plurality of images on a recording medium.

BRIEF DESCRIPTION OF THE DRAWINGS

FIGS. 11 to 19 show another embodiment of the present invention, wherein

DESCRIPTION OF THE PREFERRED EMBODIMENTS

Figure 5:
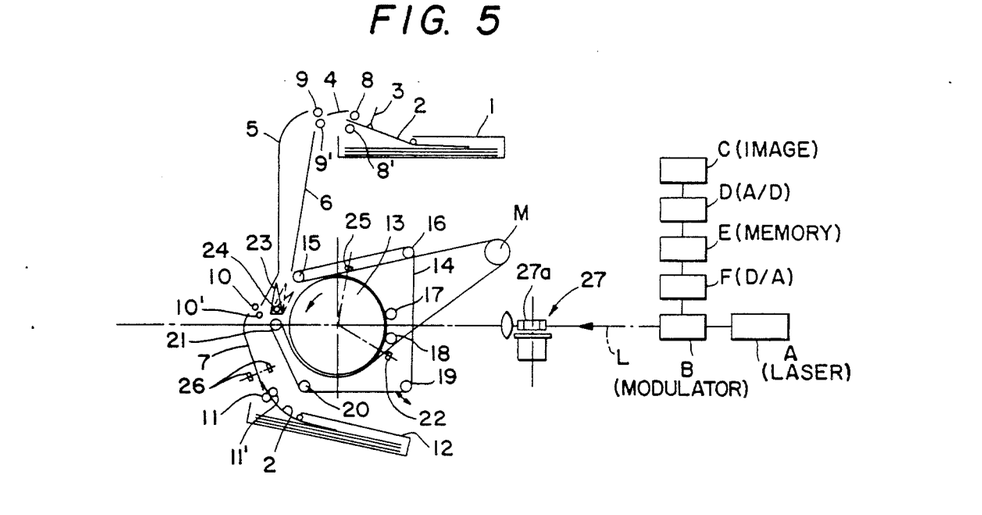
FIG. 5 schematically shows the construction of an embodiment of the present invention.

Referring to FIG. 5, A designates a laser light source, B denotes an A/0 modulating element, C designates a medical treatment image by NMR, CT, ultrasonic wave or the like, D denotes an A/D converter, E designates a frame memory, and F denotes a D/A converter. A laser beam L entering a light beam scanning optical system 27 is modulated through the A/0 modulating element B.

Figure 6:
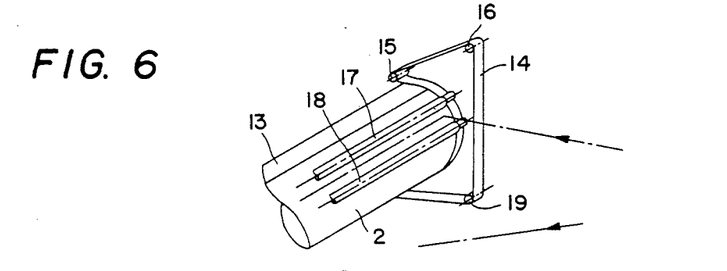
FIG. 6 is a perspective view of a rotatable member and an endless belt according to the present invention.
Figure 7:
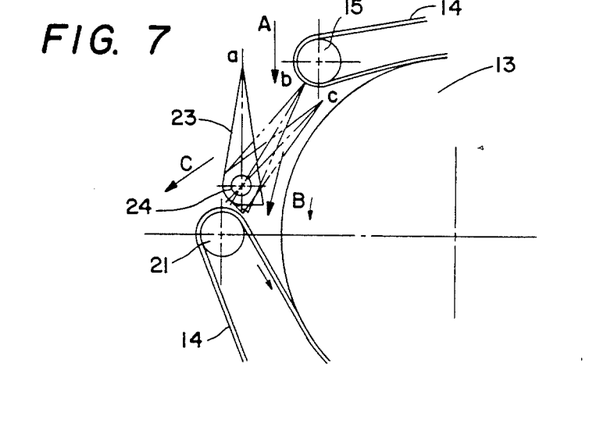
FIG. 7 is an enlarged view of a sheet direction changing movable lever according to the present invention.

In FIG. 5, reference numeral 1 designates a supply magazine for storing and supplying recording sheets 2 (for example, silver salt films). Reference numeral 3 denotes feeding means for taking out only one of the recording sheets 2 from the supply magazine 1. Reference numerals 4, 5, 6 and 7 designate guide plates for guiding the recording sheet 2 to a predetermined position, and reference numerals 8, 8', 9, 9', 10, 10', 11 and 11' denote sheet feeding rollers for feeding the recording sheet 2. Reference numeral 12 designates a container magazine for receiving the recorded recording sheets 2. Reference numeral 13 denotes a drum for subsidiary scanning having a circumference longer than the length of the recording sheet 2 in the feeding direction, reference numeral 14 designates an endless belt passed over each end of the drum 13 for subsidiary scanning as fully shown in FIG. 6, reference numerals 15, 16, 20 and 21 denote rotatable fixed rollers over which the endless belt 14 is passed, reference numeral 19 designates a roller movable in a direction to impart tension to the endless belt 14 by a spring or the like, not shown, and reference numerals 17 and 18 denote through rollers for bringing the recording sheet 2 into intimate contact with the drum 13. Reference numerals 22, 25 and 26 designate sheet position detectors, and reference numeral 23 denotes a lever rotatable about a shaft 24 to change the direction of travel of the recording sheet 2. This lever 23 acts as winding means and taking-out means for the recording sheet 2, and assumes three stages a, b and c as shown in FIG. 7. The operation of the lever 23 is accomplished, for example, by a spring or a cam, not shown. The light beam scanning optical system 27 causes the laser beam L output from the laser light source A to be reflected by a rotational polygon mirror 27a and major-scans the recording sheet 2.

Figures 8A, 8B:
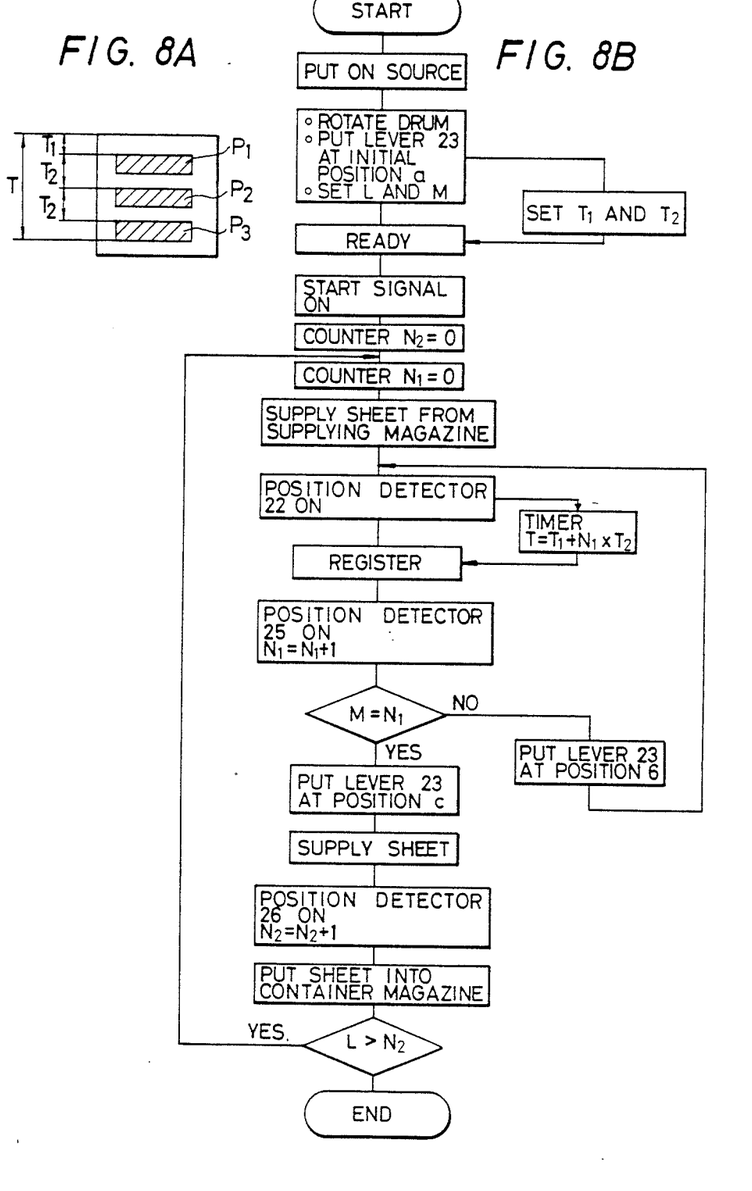
FIGS. 8A and 8B are an illustration and a flow chart, respectively, showing the operation of an embodiment of the present invention.

The operation of the present embodiment will now be described by reference to FIG. 5 and the flow chart of FIG. 8B. In FIG. 8B, L is the set value of the number of continuously recorded sheets, and M is the number of turns of the recording sheet wound on the drum and may be externally set or internally set. When a main switch is closed, the drum 13 starts to be rotated at a predetermined speed in a predetermined direction (the direction of arrow) by drum driving means M. At the same time, the endless belts 14 passing over the drum 13 are moved at a speed equal to the peripheral speed of the drum 13. At that time, the lever 23 is in its initial position a (see FIG. 7). In this state, the apparatus becomes "READY" and a recording sheet 2 is fed from the supply magazine 1 through the feeding means by an external switch or an internal start signal. Thereupon, the recording sheet 2 is guided between the drum 13 and the endless belts 14 by the lever 23 (the position a) as shown in FIG. 7 and is wound on the drum. The recording sheet 2 is position-detected by the sheet position detector 22 and, on the basis of the detection, recording of the image is started by at least one through roller 17 or 18. During the recording, as shown in FIG. 8A, time $T_1$ (i.e., the time from after the leading end of the recording sheet has been detected until the first image $P_1$ begins to be written) and time $T_2$ (i.e., the time from the position at which the image has begun to be written previously until the next image begins to be written) are set. The $(N_1+1)$th image is recorded in a time $T=N_1 \times T_2$ after the leading edge of the recording sheet has been detected.

The use of the apparatus is possible in which the drum 13 is continuously rotated during the time that areas $P_1, P_2, P_3, \ldots$ in FIG. 8A are image-recorded and the light beam scanning optical system 27 directs the light beam to the recording sheet 2 only during the recording of the areas $P_1, P_2, P_3, \ldots$. That is, in this case, the light beam is electrically turned off or intercepted by a mechanical shutter or both so that the light beam may not be directed to the other areas of the recording sheet 2 than the areas $P_1, P_2, P_3, \ldots$ to be recorded.

On the other hand, as an alternative use, a modulated scanning light beam may be caused to enter the areas $P_1, P_2, P_3, \ldots$ of the recording sheet which are to be recorded and an unmodulated scanning light beam may be caused to enter the other areas. In this case, the other areas than the areas $P_1, P_2, P_3, \ldots$ to be recorded are blackened by a light entering thereinto.

It is possible to cause predetermined information such as data to be recorded on the other areas than the recorded areas $P_1, P_2, P_3, \ldots$ by a modulated scanning light beam by the use of a memory discrete from the frame memory.

Now, as is apparent from what has been described above, the rotational polygon mirror 27a of the light beam scanning optical system 27 always can be rotated continuously with the drum 13. Where there is a problem in respect of the durability of the belts if the drum 13 is rotated continuously the drum is not rotated at all times and is stopped each time the recording of each image is terminated. In that case, it is possible that the rising characteristic of the drum start is aggravated during the next image recording and, in order to eliminate such influence, the drum 13 may be somewhat rotated before the image recording in the direction opposite to the direction of rotation during the recording and may be rotated in the forward direction from the oppositely rotated position, thereby effecting the image recording.

Now, the subsidiary scanning for the recording is accomplished by the movement of the recording sheet 2 resulting from the rotation of the drum 13. The major scanning for the recording is accomplished by the light beam scanning optical system 27, the laser light source and the beam modulating means. Further, the recording sheet 2 is detected by the sheet position detector 25 and whether the recording sheet is again wound on the drum 13 or directed away from the drum 13 is judged. The judgment, as shown in FIG. 8B, is effected by comparing the count number $N_1$ by the sheet position detector 25 with a preset count number M. Where the recording sheet is to be again wound on the drum 13 (M≠N1), the lever 23 assumes its position b and the recording sheet 2 becomes wound on the drum 13. Where the recording sheet is to go away from the drum 13 (M=N1), the lever 23 assumes its position c and the recording sheet 2 separates from the drum 13 and is scraped out by the sheet feeding rollers 10 and 10'. The sheet feeding rollers 10 and 10' are disposed at a position whereat they nip the leading end of the sheet 2 after the recording of the recording sheet 2 is terminated, so that no fluctuation may be imparted to the sheet 2 during the recording. Also, the sheet feeding rollers 10 and 10' have a one-way clutch mechanism and the peripheral speed thereof is lower than the peripheral speed of the drum 13. The recording sheet 2 scraped out is detected by the sheet position detector 26 and the next cycle becomes "READY". The sheet 2 is further received into the container magazine 12 by means of the sheet feeding rollers 11 and 11'.

The sheet feeding rollers 10 and 10' may be omitted and the sheet feeding rollers 11 and 11' may be disposed at a position whereat the recording sheet is completely liberated from the drum by the utilization of gravity.

Figure 9:
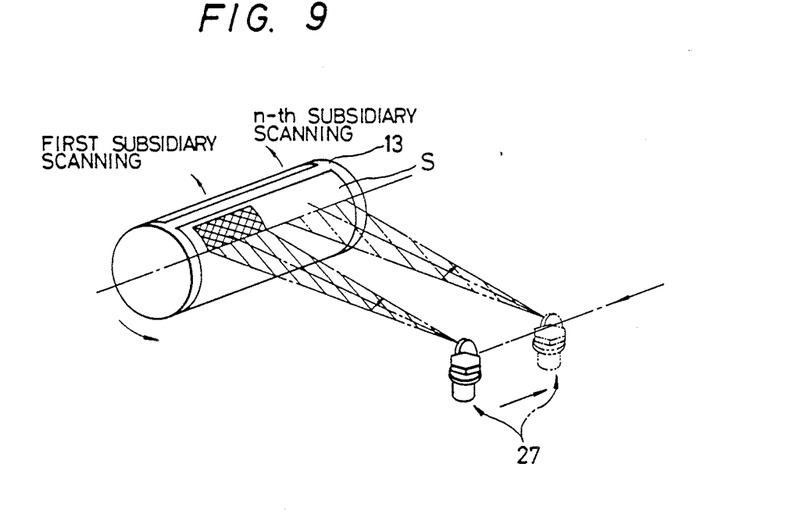
FIGS. 9 and 10 are perspective views for illustrating the multiformat recording by an embodiment of the present invention.
Figure 10:
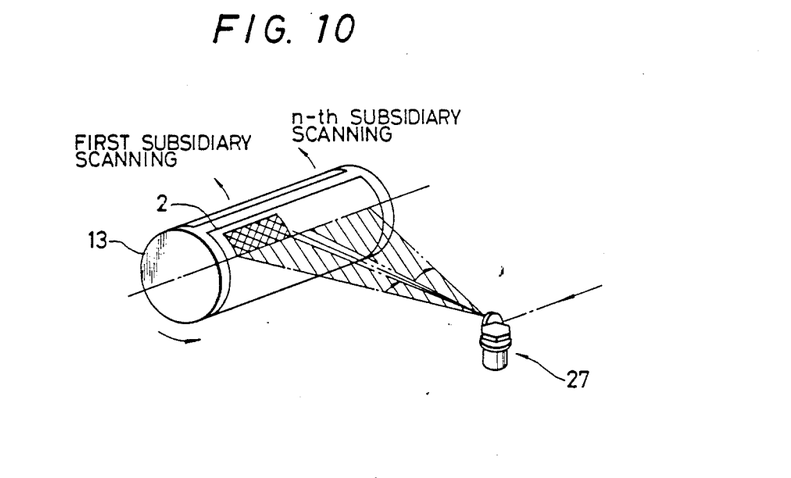

In the above-described embodiment, the recording sheet 2 can be subsidiary-scanned any number of times and therefore, as shown in FIG. 10, recording can be effected on a recording sheet n times by the use of a conventional scanning optical system of a wide scanning angle and with the scanning beam area limited to the area to be recorded, or as shown in FIG. 9, a scanning optical system of a narrow scanning angle and the recording sheet are made movable relative to each other and recording can be effected n times. In this case, it is desirable that the scanning center of the light beam scanning optical system be made coincident with the center of the image recorded. These are effective $ where the memory capacity of the frame memory is small.

In the above-described embodiment, it also possible to eliminate the direction changing movable lever and effect plural times of subsidiary scanning by the utilization of the forward and reverse rotations of the drum, that is, by the utilization of not one-way rotation but reciprocal movement. For example, image recording can be accomplished by alternately repeating the forward rotation and the reverse rotation in such a manner that in FIG. 9 or 10, the first subsidiary scanning is effected by the forward rotation, whereafter the second subsidiary scanning is effected by the reverse rotation after the area to be recorded in the major scanning direction has been shifted. Then, the third subsidiary scanning is effected by the forward rotation after a further area to be recorded in the major scanning direction has been shifted. As previously described, where during the recording by plural times of subsidiary scanning, the drum is rotated only in the forward direction and the drum is stopped after each recording is terminated, it is also possible to rotate the drum during the next recording somewhat in the direction opposite to that during the recording and effect the next subsidiary scanning from the rotated position.

In the above-described embodiment, means for winding the recording sheet 2 along the drum 13 independently of the position thereof in the direction of rotation and removing the recording sheet has been shown, but alternatively, means for gripping and winding the recording sheet 2 at a predetermined position of the drum 13 and removing the recording 5 sheet, by a chuck or a vacuum mechanism provided on the drum 13, is available. In that case, if a disc having equally spaced apart marks for detecting the rotated position of the drum is provided coaxially with the drum 13 and use is made, for example, of an encoder for generating a pulse photoelectrically for each mark, the setting of the times $T_1$ and $T_2$ as shown in FIG. 8A will become unnecessary and the rotated position of the drum can be accurately detected by counting the pulse number after the leading end o the recording sheet is detected, even if irregularity of rotation occurs to the drum.

A second embodiment of the present invention will now be described by reference to FIG. 11 and so on.

In the present embodiment, an inlet and an outlet for recording sheets are provided on the same side to thereby make the apparatus compact and also stabilize the rotation of drum during the recording. In addition, the motor for driving the drum when a recording sheet is wound on the drum and removed therefrom and the motor for driving the drum during recording are discrete from each other. The apparatus according to the present embodiment, as shown in FIG. 11, comprises a control system 110, a supply system 111, a drum system 112, a container system 113 and an optical scanner system 114. The control system 110 has a microprocessor and controls the operation of the entire system, and the supply system 111 comprises chiefly a supply magazine 120 for supplying recording sheets S and a sheet taking-out mechanism 121. The drum system 112 comprises a drum 122 rotatable in directions A and B and effects the paper supply, the image writing and the paper discharge to the recording sheets S. The optical scanner system 114 has a laser light source, not shown, a mirror 123, etc. The container system 113 comprises a guide plate 124, discharging rollers 125, 126, a sheet pushing-in mechanism 127 and a container magazine 128.

Figure 12:
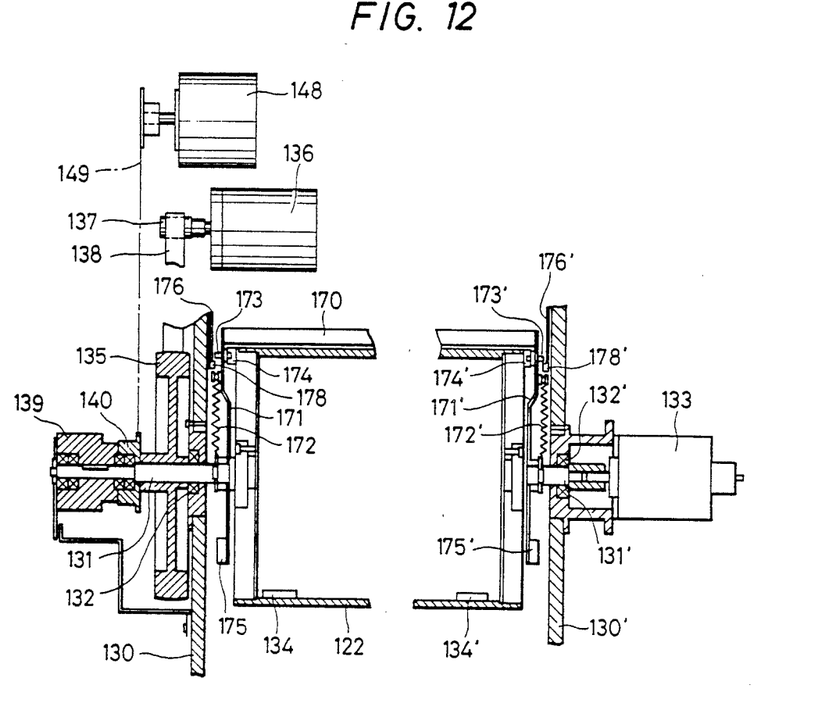
FIG. 12 is a side view of a drum driving system.
Figure 13:
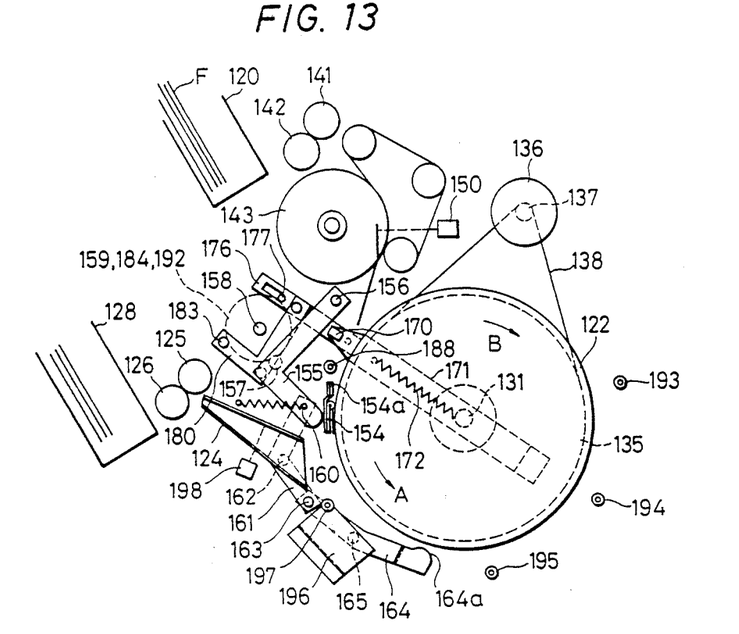
FIGS. 13-17 are views showing a structure associated with the feeding and discharging of a recording sheet S.

FIG. 12 is a side view of the drum system 112, and FIGS. 13 to 17 show the structure of the mechanism for supplying and discharging the recording sheets S. The drum 122 is disposed between fixed frames 130 and 130' and is rotatable through drum shafts 131, 131' and bearings 132, 132'. An encoder 133 for detecting the position of the drum 122 is supported on the drum shaft 131', and balance weights 134 and 134' are attached to the inner surface of the drum 122 so that the distribution of weight is balanced. A pulley 135 is fixed to the drum shaft 131, and an endless belt 138 of small inertial mass is passed between the pulley 135 and a pulley 137 mounted on the drive shaft of a writing electric motor 136. A sprocket 140 is mounted on the drum shaft 131 through a clutch 139, and a chain 149 driven by a winding electric motor 148 is passed over the sprocket 140 and supplying rollers 141, 142, 143 and discharging rollers 125, 126 shown in FIG. 13. When the clutch 139 becomes engaged, the drum 122, the feeding rollers 141, 142, 143 and the discharging rollers 125, 126 are driven at a time by the winding electric motor 148, and the number of teeth of the sprocket 140 and of the unshown sprocket of the group of rollers is chosen so that the peripheral speeds of these members are the same. Also, a detector 150 for detecting the recording sheet S is disposed at the feed entrance to the drum 22, as shown in FIG. 13.

Figure 14:
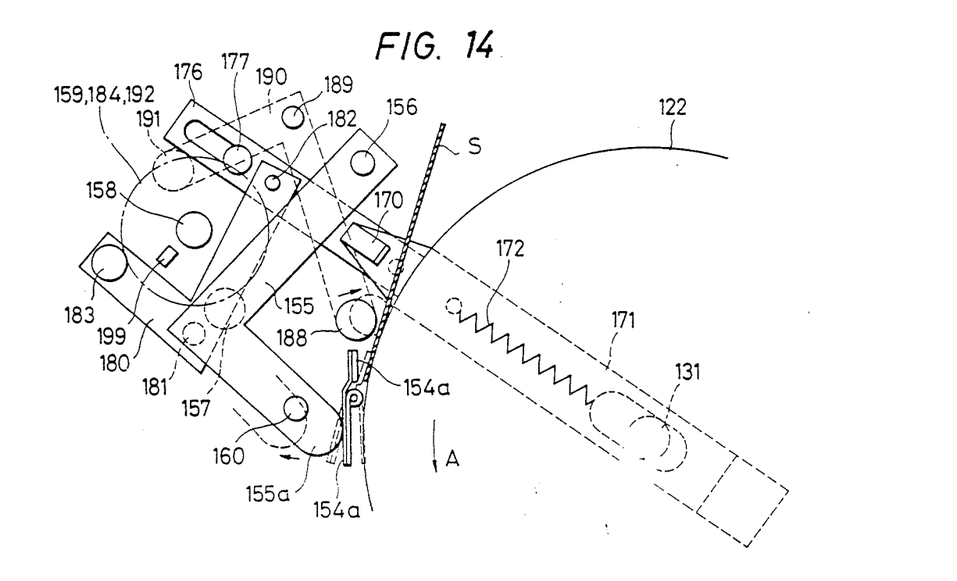

In FIGS. 13 and 14, a front chuck member 154 of the hinge type provided with a spring and having a length capable of being urged against the drum 122 over the full length thereof is mounted on the drum 122, and the nipping portion 154a of the front chuck member 154 for nipping the recording sheet S between it and the peripheral surface of the drum 122 is biased toward the peripheral surface of the drum 122 by a spring. This nipping portion 154a is adapted to be librated and opened with respect to the peripheral surface of the drum 122 by a fore end opening lever 155 in a predetermined position of the drum 122. The fore end opening lever 155 is rotatable about a shaft 156, and a pressing portion 155a at the fore end of the fore end opening lever 155 effects a predetermined movement with the aid of a roller 157 mounted on the fore end opening lever 155 and a cam 159 supported on a cam shaft 158, and this movement liberates the nipping portion 154a.

A shaft 160 is provided near the pressing portion 155a, and a relay lever 161 is supported on this shaft 160 for rotation about a shaft 162, and the other end of the relay lever is connected to a lever 164 through a connecting shaft 163, the lever 164 being rotatable about a shaft 165. Accordingly, with the movement of the fore end opening lever 155, the pressing portion 164a of the lever 164 effects a movement similar to that of the pressing portion 155a of the fore end opening lever 155.

Also, a rear chuck member 170 having a length capable of being urged against the drum 122 over the full length thereof is disposed on the outer periphery of the drum 122, and the opposite ends of the rear chuck member 170 are fixed to support plates 171 and 171' in the form of rectangular plates. The support plates 171 and 171' are rotatable relative to drum shafts 131 and 131', respectively, and are slidable in the radial direction of the drum 122, and further are normally biased toward the drum shafts 131 and 131', respectively, by springs 172 and 172' provided between the drum shafts 131 and 131'.

A pin 173 is secured to each of the support plates 171 and 171' and the tip end thereof is adapted to drop into a groove 174 provided in a side of the drum 122. Further, balance weights 175 and 175' are attached to the support plates 171 and 171', respectively, so that the drum 122 can maintain a balanced state of the distribution of weight during the rotation thereof irrespective of the position of $ the rear chuck member 170. A slide lever 176 is slidably mounted on the frames 130 and 130' through a shaft 177, and a top 178 is mounted on the tip end of the slide lever 176.

A rear end opening lever 180 for operating the rear chuck member 170 is pivotable about a shaft 181 and one end thereof is fitted to a shaft 182 provided in the slide lever 176 and the other end thereof is provided with a roller 183. The roller 183 is adapted to move in contact with a cam 184 provided on the cam shaft 158.

An urge roller 188 is provided between the rear chuck member 170 and the front chuck member 154, and this urge roller 188 has a length capable of being urged against the drum 122 over the full length thereof and is rotatably supported on one end of a lever 190 pivotable about a shaft 189. The other end of the lever 190 is provided with a roller 191, and the lever 190 is adapted to move in contact with a cam 192 supported on the cam shaft 158. Also, the lever 190 is biased by a spring in a direction to urge the urge roller 188 against the peripheral surface of the drum 122.

Rotatable keep rollers 193, 194 and 195 shown in FIG. 13 are supported by the frames 130 and 130', and guide plates 124 and 196 for guiding the recording sheet S are fixed to the frames 130 and 130'.

A rotatable keep roller 197 is provided on a guide plate 196, and a detector 198 for detecting the leading end of the recording sheet S when contained is disposed near the guide plate 124. A photodetector 199 is provided near the cam shaft 158 to detect the rotated position of the cam shaft 158 as will later be described.

Figure 18:
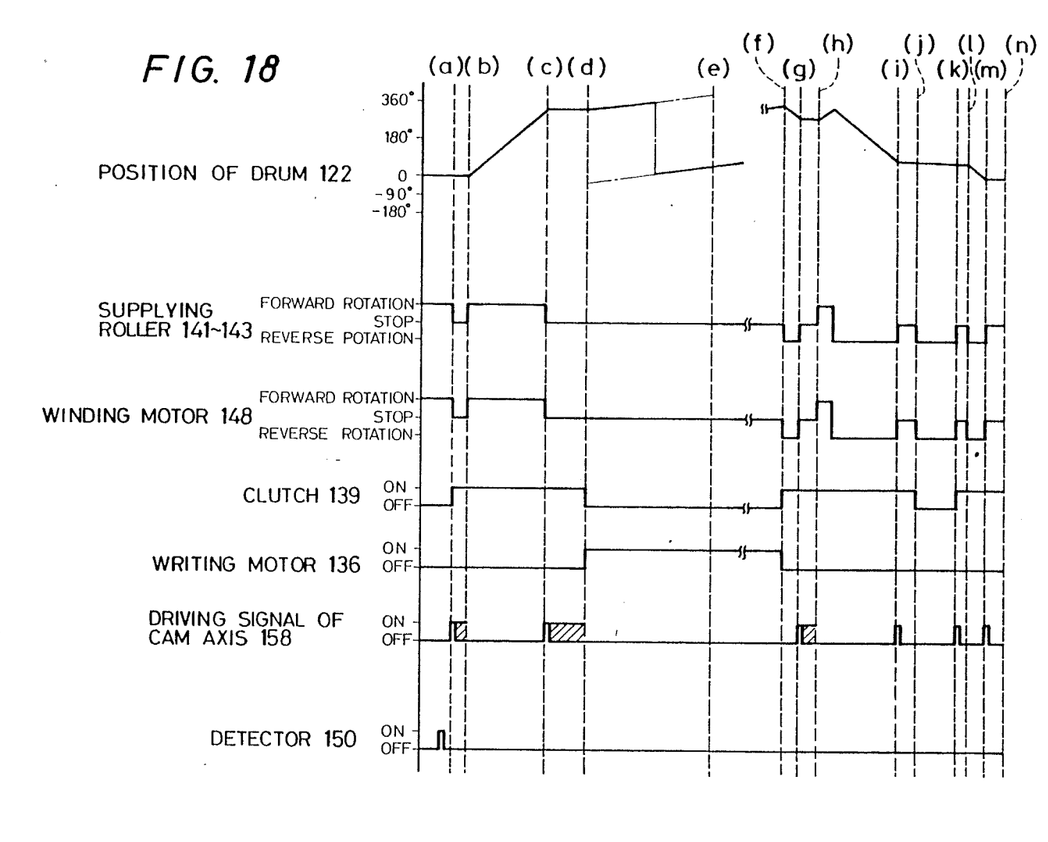
FIGS. 18 and 19 are timing charts of a detecting mechanism and an operating mechanism, respectively.
Figure 19:
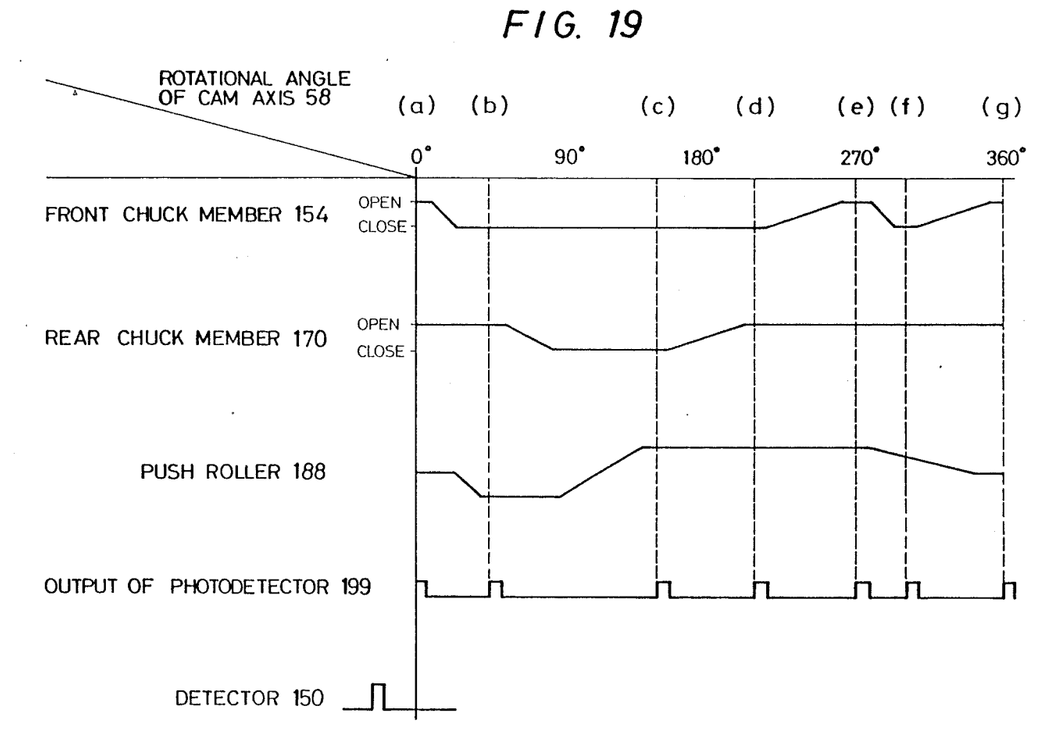

The present embodiment has the above-described construction and the operation thereof will now be described. FIGS. 18 and 19 show the operation timing of each mechanism. The drum 122 is stopped at the position of angle 0° as the initial position and, as shown in FIG. 14, the nipping portion 154a of the front chuck member 154 is separated from the peripheral surface of the drum 122 by the pressing of the fore end opening lever 155 through the cam 159. Also, the slide lever 176 is raised by the cam 184 and the rear end opening lever 180, and the rear chuck member 170 is lifted through the top 178 and pin 173 provided on the tip end of the slide lever 176, and in this state, the drum 122 is rotatable independently of the rear chuck member 170. Further, the urge roller 188 is stopped at a position somewhat spaced apart from the peripheral surface of the drum 122 by a cam 192 and a lever 190, and in this state, the preparation for winding the recording sheet S is completed.

Figure 11:
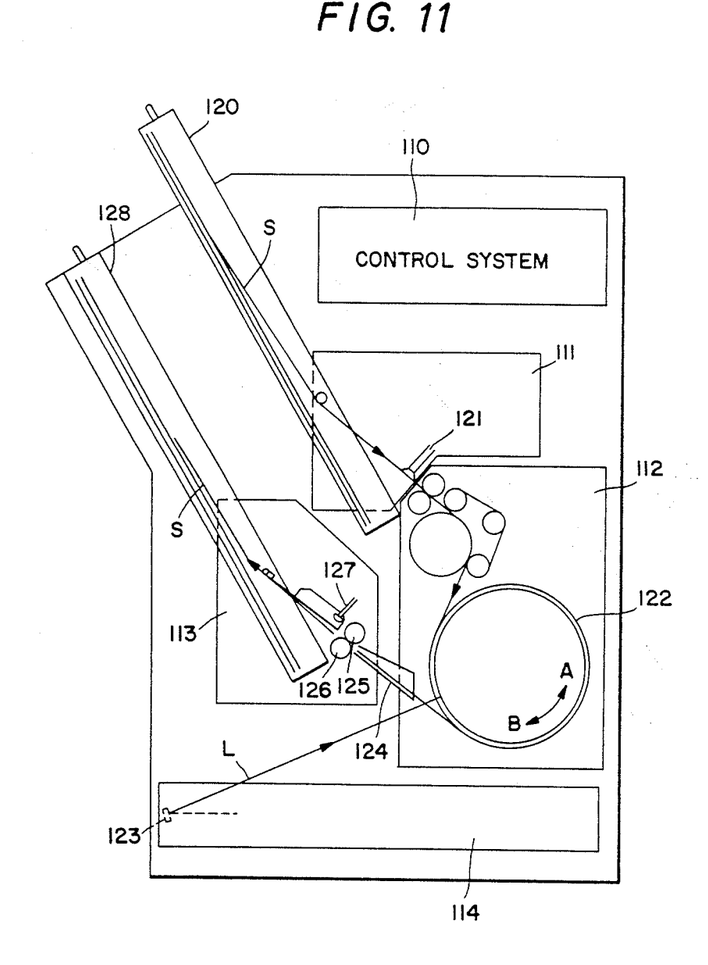
FIG. 11 is a view showing the construction of the system.

In FIG. 11, a recording sheet S is taken out from the supply magazine 120 by a sheet taking-out mechanism 121 comprising a vacuum type sucker. Subsequently, the winding electric motor 148 shown in FIG. 12 revolves in the forward direction and the supplying rollers 141, 142, 143 are operated through the chain 149, whereby the recording sheet S is fed onto the drum 122. At this time, the clutch 139 is disengaged and the drum 122 is stopped in its initial state. In FIG. 13, the position of the leading edge of the recording sheet S is detected by the detector 150 and, when the leading end of the recording sheet S arrives at the nipping portion 154a of the front chuck member 154, the winding electric motor 148 is stopped in FIG. 18(a) and the recording sheet S is also stopped. If, for example, the winding electric motor 148 is a stepping electric motor, the timing of this stoppage can be controlled by counting a predetermined number of pulses after the detection signal of the detector 150. Here, by a driving signal to the cam shaft 158, the cam shaft 158 is rotated from its position of FIG. 19(a) to its position of FIG. 19(b) with the aid of a cam driving electric motor, not shown. That is, the pressing portion 155a of the fore end opening lever 155 is separated from the front chuck member 154 and, as indicated by dotted line in FIG. 14, the nipping portion 154a of the front chuck member 154 is urged against the peripheral surface of the drum 122 and holds the leading edge of the recording sheet S.

Figure 15:
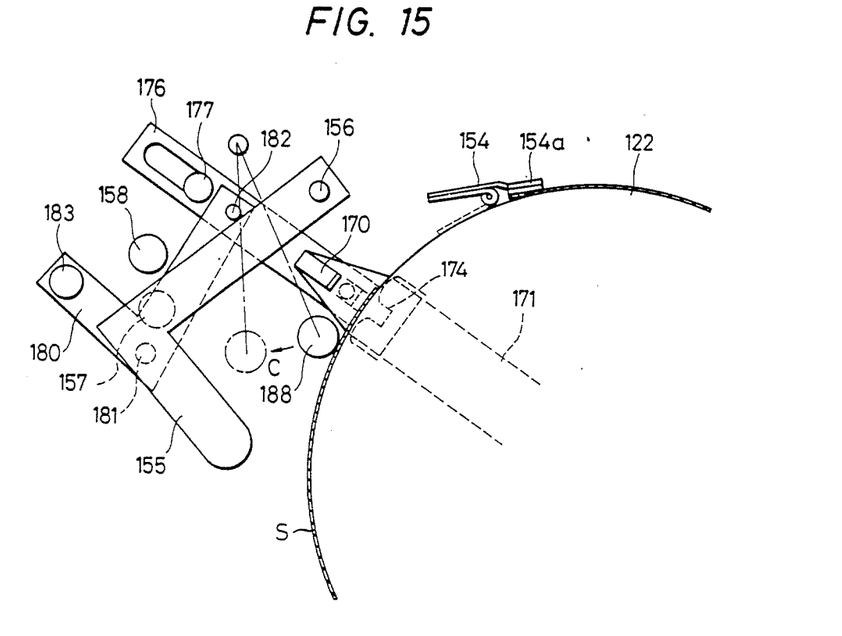

Also, the urge roller 188 is moved by the operation of the cam 192 through the lever 190 and urges the recording sheet S against the peripheral surface of the drum 122. Subsequently, the clutch 139 is engaged by the signal of the photodetector 199 for detecting the position of the shaft 133, the winding electric motor 148 begins forward revolution, the supplying rollers 141, 142, 143 and discharging rollers 125, 126 are rotated and the drum 122 begins to rotate in the counter-clockwise direction A. Accordingly, the recording sheet S is urged against the drum 122 by the urge roller 188 and wound on the peripheral surface of the drum while the leading end thereof remains held by the front chuck member 154. When the drum 122 comes to a present position, that is, when the trailing end of the recording sheet S comes to below the rear chuck member 170 as shown in FIG. 15, the winding electric motor 148 is stopped as shown in FIG. 18(c).

Subsequently, by a driving command to the cam shaft 158, the cam shaft 158 is rotated to the position of FIG. 19(c). The rear chuck member 170 is urged against the peripheral surface of the drum 122 through the cam 184, the rear end opening lever 18 and the slide lever 176 and holds the trailing edge of the recording sheet S. At this time, the tip end portion of the pin 173 which connects the slide lever 176 to the support plate 139 drops into the groove 174 and the other end portion thereof separates from the slide lever 176 and thus, the pin 173 becomes rotatable following the drum 122 with the rear chuck member 170. Also, the urge roller 188 is greatly separated from the peripheral surface of the drum 122 by the cam 192 and the lever 190 as indicated by arrow C in FIG. 15 to permit passage of the rear chuck member 170 urged against the drum 122 whereby the winding of the recording sheet S onto the drum 122 is completed.

This state corresponds to FIG. 18(d), and the clutch 139 becomes disengaged and the writing electric motor 136 begins to revolve, so that the drum 122 is further rotated in the direction A. When the leading end of the recording sheet S reaches the writing position detected by the encoder 133 shown in FIG. 12, that is, assumes the state shown in FIG. 18(e), the writing into the recording sheet S is started by the use of the optical scanner system 114. This writing is effected while the drum 122 is rotated, and the termination of the writing is commanded by a position signal representative of a predetermined position of the drum 122 or a termination signal from outside, and in the state of FIG. 18(f), the writing electric motor 136 is stopped and the drum 122 is stopped.

A flexible endless belt may be used between the writing electric motor 136 and the drum 122 to reduce the irregularity of the high frequency revolution of the writing electric motor 136 during the writing. Alternatively, an electric motor having a high torque characteristic and a high stable revolution characteristic may be used as the writing electric motor 136 to effect transmission of power in a form in which the motor is directly connected to the rotary shaft of the drum 122.

As regards the recovery of the recording sheet S into which the writing has been completed, the clutch 139 first becomes engaged in the position of FIG. 18(f), and then the winding electric motor 148 revolves in the reverse direction and the drum 122 is rotated to the position of FIG. 18(g) in the clockwise direction B. When this position, i.e., the positional relation shown in FIG. 15, is restored, the cam shaft 158 is rotated to the position of FIG. 19(d) by a cam driving signal to operate the cam 184 and the rear end opening lever 180, and the rear chuck member 170 separates from the peripheral surface of the drum 122 and liberates the trailing end of the recording sheet S.

Figure 16:
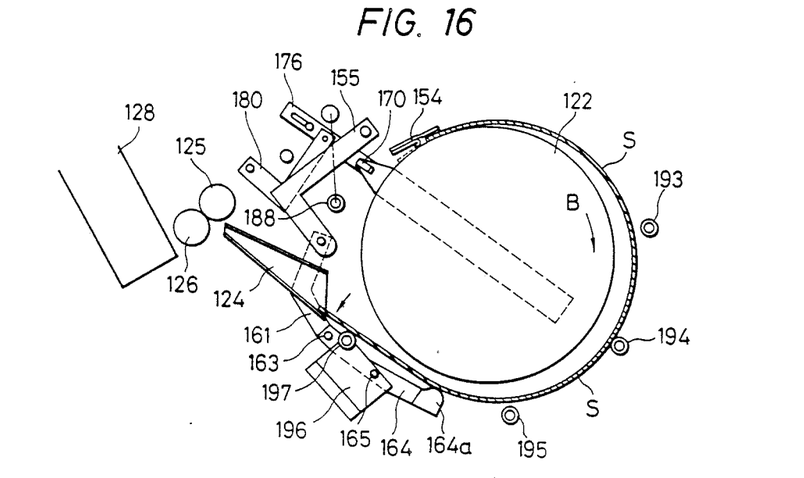
Figure 17:
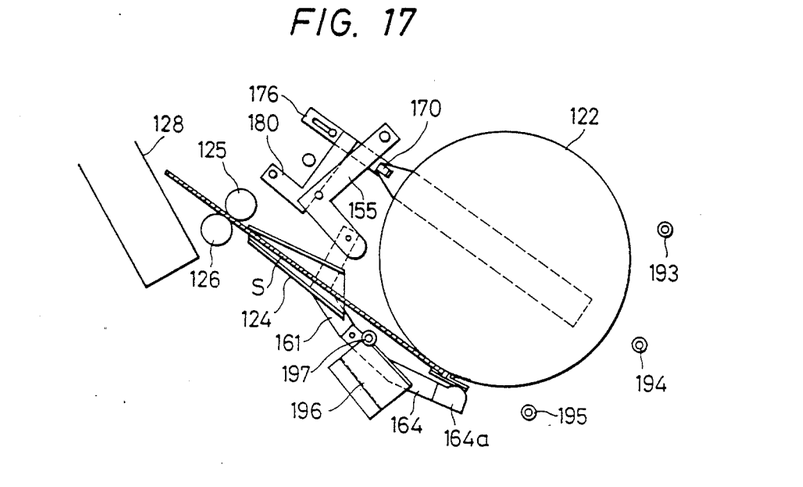

When the winding electric motor 148 revolves in the direction A to the predetermined position of FIG. 18(h) by the signal of the photodetector 199, the trailing edge of the recording sheet S faces the guide plate 124 due to its elastic restitutional force, as shown in FIG. 16. When the drum 122 is subsequently rotated in the direction B, the trailing end of the recording sheet S is guided into the guide plate 124 so as to be forced out by the front chuck member 154 and is nipped between the discharging rollers 125 and 126 rotating at the same peripheral speed as the peripheral speed of the drum 122, whereby the recording sheet S is fed to the container magazine 128.

Rotatable keep rollers 193, 194, 195 and 197 serve to prevent the bulging of the recording sheet S and also smoothly effect the change of the recording sheet from its curved state on the peripheral surface of the drum 122 to its planar state. When the front chuck member 154 comes to the predetermined position of FIG. 18(i), i.e., the position shown in FIG. 17, the winding electric motor 148 is stopped and the drum 122 is also stopped. Subsequently, by a driving command to the cam shaft 158, the cam shaft 158 is rotated to the position of FIG. 19(e), and the nipping portion 154a of the front chuck member 154 separates from the peripheral surface of the drum 122 through the cam 159, the fore end opening lever 155, the relay lever 161, the lever 164 and the pressing portion 164a and thus, the recording sheet S becomes liberated from the drum 122.

Then, the winding electric motor 148 is revolved by the signal of the photodetector 199 in FIG. 19(e) to drive the discharging rollers 125 and 126 and feed the recording sheet S into the container magazine 128. At this time, the clutch 139 is disengaged and the drum 122 remains stopped. When the recording sheet S is received into the container magazine 128, the cam shaft 158 rotates until it assumes the position of FIG. 19(f), and the front chuck member 154 is liberated from the pressing portion 164a of the lever 164. Subsequently, the winding electric motor 148 is revolved by the signal of the photodetector 199 shown in FIG. 19(f), the clutch 139 becomes engaged and the drum 122 is rotated in the direction B and returns to the position of FIG. 18(m) which is its initial position. By a driving signal to the cam shaft 158, the cam shaft 158 is rotated to its initial position of FIG. 19 (a), and the front chuck member 154, the urge roller 188 and the rear chuck member 170 also assume their initial positions, thus completing the whole operation.

In the present embodiment, the complicated rotational system of great inertia associated with the feeding and discharging of recording sheets is driven by the winding electric motor and the inertial system unnecessary in the stage of writing operation by a light beam is separated and only the minimum essential inertial system comprising a drum of good balance on which a recording sheet has been wound is driven by the writing electric motor, whereby a stable peripheral speed can be realized and images of high quality can be obtained and formation of plural images and compactness of the apparatus can be realized.

The present invention is not restricted to the above-described embodiments, but of course, various modifications thereof are possible within the scope of the invention as defined in the appended claims.

We claim:
1. Image recording apparatus comprising:
   a rotatable endless carrying body for recording an image on a recording sheet, said endless carrying body being in contact with the recording sheet in a recording position;
   means for supplying the recording sheet to the recording position;
   means for discharging the recording sheet from the recording position;
   a first motor for driving said endless carrying body with the recording sheet during execution of a recording process;

means for scanning a light beam in a direction intersecting a driving direction of the recording sheet; and a second motor for driving said endless carrying body and at least one of said supplying means and said discharging means during non-execution of the recording process.

2. Image recording apparatus according to claim 1, further comprising clutch means for changing between said first and second motors.

3. Image recording apparatus according to claim 2, wherein said clutch means changes between said first and second motors to cause a drive force to be transmitted to a rotating shaft fixed to said endless carrying body.

4. Image recording apparatus according to claim 1, wherein said recording sheet is wound on said endless carrying body.

5. Image recording apparatus according to claim 4, further including chucking means for holding a front end portion and a rear end portion of said recording sheet to said endless carrying body.

6. Image recording apparatus according to claim 5, further including balance weights coupled to said chucking means.

7. Image recording apparatus comprising:
a rotatable endless carrying body for recording an image on a recording sheet, said endless carrying body being in contact with the recording sheet in a recording position;
means for supplying the recording sheet to the recording position;
means for discharging the recording sheet from the recording position;
a first motor for driving said endless carrying body with the recording sheet during execution of a recording process;
means for scanning a light beam in a direction intersecting a driving direction of the recording sheet; and
a second motor for driving at least said endless carrying body with the recording sheet during at least one of the periods when the recording sheet is being supplied and when the recording sheet is being discharged.

8. Image recording apparatus according to claim 1 or 7, wherein said first motor comprises a continuous rotation motor suitable for driving the endless body with high rotation accuracy and, during execution of the recording process, driving only said endless body with said recording sheet by disconnecting other members.

9. Image recording apparatus according to claim 1 or 7, wherein said second motor comprises a stepping motor suitable for stepping rotation control and driving said endless body and at least one of said supplying means and said discharging means during non-execution of the recording process.

* * * * *

UNITED STATES PATENT AND TRADEMARK OFFICE
CERTIFICATE OF CORRECTION

PATENT NO. : 4,918,466
DATED : April 17, 1990
INVENTOR(S) : KAZUHISA TAKAHASHI, ET AL.

It is certified that error appears in the above-identified patent and that said Letters Patent is hereby corrected as shown below:

On the title page:

IN [30] FOREIGN APPLICATION PRIORITY DATA

"Mar. 22, 1984 [JP] Japan ................ 60-053485
Nov. 27, 1984 [JP] Japan ................ 60-250308"

should read

--Mar. 22, 1984 [JP] Japan ................ 59-053485
Nov. 27, 1984 [JP] Japan ................ 59-250308--.

IN [56] REFERENCES CITED

U.S. PATENT DOCUMENTS, "Kiyohare" should read --Kiyohara--.

COLUMN 1

Line 14, "the obtained by" should be deleted and "as CT" should read --as that obtained by CT--.
Line 21, "an" should read --the--.
Line 59, "via is" should read --via supplying rollers 204a, 204b and a guide plate 205, is--.
Line 68, "other force" should read --force other--.

COLUMN 5

Line 37, "$" should be deleted.
Line 40, "it also" should read --it is also--.

UNITED STATES PATENT AND TRADEMARK OFFICE
CERTIFICATE OF CORRECTION

PATENT NO. : 4,918,466
DATED : April 17, 1990
INVENTOR(S) : KAZUHISA TAKAHASHI, ET AL.   Page 2 of 2

It is certified that error appears in the above-identified patent and that said Letters Patent is hereby corrected as shown below:

COLUMN 6

Line 1, "recording 5" should read --recording--.
    Line 18, "drum during the" should read
        --the drum during--.
    Line 63, "drum 22," should read --drum 122,--.

COLUMN 7

Line 43, "$" should be deleted.

COLUMN 9

Line 8, "rear end opening lever 18" should read
        --rear end opening lever 180--.

Signed and Sealed this

Nineteenth Day of January, 1993

*Attest:*

DOUGLAS B. COMER

*Attesting Officer*   Acting Commissioner of Patents and Trademarks